(12) United States Patent
Neuburger

(10) Patent No.: US 10,247,754 B2
(45) Date of Patent: Apr. 2, 2019

(54) MEASURING DEVICE HAVING AN INTERFACE

(71) Applicant: KROHNE MESSTECHNIK GMBH, Duisburg (DE)

(72) Inventor: Stephan Neuburger, Stadecken-Elsheim (DE)

(73) Assignee: KROHNE MESSTECHNIK GMBH, Duisburg (DE)

( * ) Notice: Subject to any disclaimer, the term of this patent is extended or adjusted under 35 U.S.C. 154(b) by 0 days.

(21) Appl. No.: 14/780,112

(22) PCT Filed: Mar. 7, 2014

(86) PCT No.: PCT/EP2014/054478
§ 371 (c)(1),
(2) Date: Nov. 17, 2015

(87) PCT Pub. No.: WO2014/154471
PCT Pub. Date: Oct. 2, 2014

(65) Prior Publication Data
US 2016/0084877 A1 Mar. 24, 2016

(30) Foreign Application Priority Data
Mar. 27, 2013 (DE) .................. 10 2013 005 226

(51) Int. Cl.
*G01R 1/04* (2006.01)
*G01D 21/00* (2006.01)

(52) U.S. Cl.
CPC ........... *G01R 1/0416* (2013.01); *G01D 21/00* (2013.01)

(58) Field of Classification Search
CPC ................ G01R 15/181; G01R 15/207; G01R 19/0092; G01R 1/22; G01R 1/203
(Continued)

(56) References Cited

U.S. PATENT DOCUMENTS 3,109,141 A * 10/1963 Blackwell .......... G01R 19/0023
313/607
4,009,477 A * 2/1977 Rozylowicz ........... G01R 11/04
324/126
(Continued)

FOREIGN PATENT DOCUMENTS

DE 9109176 U1 9/1991
DE 10163165 A1 7/2003
(Continued)

OTHER PUBLICATIONS

1 International Search Report issued in a corresponding PCT/EP2014/054478 dated May 26, 2014.

*Primary Examiner* — Christopher P McAndrew
(74) *Attorney, Agent, or Firm* — David S. Safran; Roberts Mlotkowski Safran Cole & Calderon, P.C.

(57) ABSTRACT

A measuring device (1) for determining a measured variable has a sensor device (2) that generates at least one primary signal depending on the measured variable to be determined, an electronics device (3), a transition section (4) located between the sensor device (2) and the electronics device (3), an interface (5) arranged in the transition section (4) for transmitting energy and/or signals and having at least one signal line (7) between the sensor device (2) and the electronics device (3) are provided. To provide a measuring device that has an interface for transmitting signals or energy, which is easier to access than in the measuring device of the prior art, the interface (5) and the signal line (7) can be reversibly connected for transmitting signals to one another.

11 Claims, 5 Drawing Sheets

(58) Field of Classification Search
USPC .......................................................... 324/126
See application file for complete search history.

(56) References Cited

U.S. PATENT DOCUMENTS

| | | | | |
|---|---|---|---|---|
| 4,085,298 A * | 4/1978 | Seidel | ................. | H04M 3/2272 |
| | | | | 324/126 |
| 4,945,304 A * | 7/1990 | Feron | ................. | G01R 27/16 |
| | | | | 324/107 |
| 5,336,991 A * | 8/1994 | Atherton | ............ | G01R 21/1331 |
| | | | | 324/126 |
| 5,606,513 A | 2/1997 | Louwagie et al. | | |
| 6,302,592 B1 * | 10/2001 | Zullig | ................. | G02B 6/3849 |
| | | | | 385/56 |
| 6,424,758 B1 * | 7/2002 | Cheng | ................. | G02B 6/4292 |
| | | | | 385/16 |
| 6,807,979 B2 * | 10/2004 | Koch | ................. | B65G 69/183 |
| | | | | 134/166 R |
| 6,959,511 B2 * | 11/2005 | Johnson | ................. | E06B 7/32 |
| | | | | 160/180 |
| 6,993,371 B2 * | 1/2006 | Kiani | ................. | A61B 5/14551 |
| | | | | 600/323 |
| 6,995,580 B2 * | 2/2006 | Macphail | ................ | G01R 27/06 |
| | | | | 324/126 |
| 7,525,419 B2 | 4/2009 | Orth et al. | | |
| 7,536,210 B1 * | 5/2009 | Morris | ................. | G06F 1/1626 |
| | | | | 455/575.1 |
| 8,395,397 B1 * | 3/2013 | Handshoe | ........... | G01R 27/2605 |
| | | | | 324/126 |
| 2004/0147823 A1 * | 7/2004 | Kiani | ................. | A61B 5/14551 |
| | | | | 600/323 |
| 2008/0004726 A1 | 1/2008 | Gehring et al. | | |
| 2012/0119791 A1 * | 5/2012 | Hsiao | ................. | G01D 21/00 |
| | | | | 327/100 |
| 2014/0032177 A1 | 1/2014 | Altendorf et al. | | |

FOREIGN PATENT DOCUMENTS

| | | |
|---|---|---|
| DE | 102006055900 A1 | 6/2007 |
| DE | 202006020112 U1 | 10/2007 |
| DE | 102007053592 A1 | 5/2009 |

* cited by examiner

MEASURING DEVICE HAVING AN INTERFACE

BACKGROUND OF THE INVENTION

Field of the Invention

The invention relates to a measuring device for determining a measured variable. At least one sensor device and one electronics device are thereby provided. The sensor device generates at least one primary signal depending on the measured variable to be determined. A transition section is located between the sensor device and the electronics device. Furthermore, at least one interface for transmitting energy and/or signals is provided, which is arranged in the transition section. Additionally, at least one signal line for transmitting at least signals is located between the sensor and electronics devices. The signals can be present either in digital or analog mode.

Description of Related Art

In order to regulate and monitor processes, operations and states, a plurality of measuring devices are used in modern process and manufacturing automation, which determine measured variables and thereby make the process to be monitored or regulated observable, specifically influenceable, and thus, safe.

The measuring devices consist essentially of at least one sensor device and one electronics device. The sensor device interacts with the process or a process variable and generates a—normally electric—primary signal therefrom, which is dependent on the measured variable.

An electronics device is normally provided in order to connect the measuring device to a field bus or in order to allow, for example, regulation or energy supply of the sensor device. The sensor device is partially given a certain degree of intelligence by the electronics device. Alternatively, the electronics device transforms the primary signal of the sensor device and thus is used as a so-called transmitter.

The sensor device can thereby also have its own electronic elements for processing the actual measuring signal in view of the measured variable to be determined. Furthermore, in some measuring devices, the electronics unit is also used only for energy supply of the sensor device. Thus a plurality of variations is known.

The sensor and the electronics devices are partially spatially separated from one another in the prior art. Both devices are partially connected to one another by means of corresponding housing arrangements, so that a one-piece measuring device is the result.

Measuring devices with a modular construction are shown, for example, in German Patent Application DE 101 63 165 A1, U.S. Pat. No. 7,525,419 B2, German Utility Model DE 91 09 176 U1 or German Patent Application DE 10 2011 006 989 A1 which corresponds to U.S. Patent Application Publication 2014/0032177 A1.

Communication of the measuring device with other devices or also with higher-level control rooms takes place via the interfaces. A particular interface is thereby occasionally available on the measuring device for direct local intervention by a user using a display as human machine interface.

A similar measuring device is shown, for example, in U.S. Pat. No. 5,606,513. An interface is arranged between a sensor device and an electronics device, via which the measured values of a separate sensor are supplied to the electronics device. Thereby, a signal line exists between the sensor device and the electronics device and a signal line runs from the interface to the electronics device.

It is known from the prior art to provide so-called service interfaces, which allow for a more extensive intervention in the measuring device and allow for greater amounts of data, e.g., for an actualization of programs, to be transferred to the measuring device. Thereby, another data protocol can optionally be used than in an already existing standard interface. Often, other data than what is accessible via a standard interface can be partially read from the measuring device via such service interfaces.

German Patent Application DE 10 2006 055 900 A1 describes an adapter for implementing a connection between field devices and mobile devices, such as a laptop or a mobile phone.

Such service interfaces are normally separately protected, or arranged or designed offset. In this manner, for example, service interfaces are located behind a removable display unit or are protected by special covers.

Hence, however the problem often arises that such interfaces are often difficult to access. Further, it is possible that electronic components are exposed by removing the cover of such an interface so that, in particular, access to such interfaces is impermissible in areas at risk of explosion. Furthermore, measuring devices are often connected to a bus system via their standard interface so as to not create interfering influences there.

SUMMARY OF THE INVENTION

The object of the invention is thus to provide a measuring device that has an interface for transmitting signals or energy, which is easier to access than in the measuring device of the prior art.

The measuring device according to the invention, with which the above described and derived object is achieved, is initially and essentially characterized in that the interface and the signal line can be reversibly connected at least for transmitting signals to one another.

It is sometimes common in the prior art that an interface for input and output of signals or for energy supply of the measuring device is provided only in the area of the electronics device. At least one interface is situated between the sensor device and the electronics device in the measuring device according to the invention. Thereby, an area is used that is usually defined by the geometry of the measuring device and by the installation of the device at the measuring site and is therefore more easily accessible and often even exposed.

Furthermore, due to the interface, the signals of the sensor device can also be tapped before the transition to the electronics device or can be directly impinged on the sensor device by bypassing the electronics device.

Through the signal line between the sensor and electronics device, there is a possibility of data transmission between the two devices. According to the invention, the interface and the signal line are—at least for the transmission of signals—reversibly connected to one another.

A reversible connection can be removed so that, for example, a connection between the interface and the signal line only exists temporarily, and thus, access to the signal line is only intermittently possible via the interface.

The reversible connection further means, in one design, that the interface is reversible as an interface, i.e., exists reversibly and thus can again cease to exist in its function.

The latter can be implemented, for example, in that the possibility of access to the interface is not always available, rather is only established at certain points in time and, namely, at times in which access to the signal line is necessary.

It is thereby provided in one variation that the signal traffic via the signal line is only read, without influencing communication, in that, for example, the electric currents or voltages associated with the signals are tapped. In a further variation, the interface is used for direct access to the sensor device or the electronics device so that signals can be introduced into the signal line via the interface.

In one variation, the interface is thereby suitable for a plug with pins and allows for, in an alternative design, the connection of cables or other electric lines. In a further variation, the interface is at least partially designed as a PG socket.

The energy involved and to be transmitted is electrical energy in one variation.

In one design, the signals are data that is issued in analog or digital form, and in an additional or alternative design, the signals are a temporal course of measured data or variables dependent thereon.

Depending on design and use, the signals are also information about the device so that, for example, the serial number or history data or set parameter values of the measuring device can be read via the interface.

Alternatively, data is supplied to the measuring device via the interface, e.g., new software of firmware. Calibration data, configuration data or general user data are possibly also communicated as signals via the interface.

In an additional or alternative design, the interface allows for a test of the sensor device or electronics device or, optionally, also the signal line. Hereby, the interface allows for, in particular, the input of test signals in order to simulate, e.g., the reaction of the electronics device to certain primary signals. In a further design, a primary signal is directly read via the interface and compared to the signal or the value that the electronics device generates therefrom.

In a further design, the interface is used for wireless communication by using radio signals.

Further designs of the interface include a magnetic-inductive or capacitive coupling that is provided via the interface for the transmission of signals and/or power.

In one design, the transition section is implemented at least partially in a neck shape.

In order to move the electronics device further from the process and also to improve the readability or operability of a display associated with the electronics device, a sort of neck is often located between the two components of the measuring device. In the design of the transition section, it is thereby necessary that sufficient space is available for the interface.

According to one design, the measuring device has only the interface for the transmission of energy and signals. In an additional design, additional interfaces—according to the invention or in the form of standard interfaces—are provided as part of the measuring device.

In one design, at least one standard interface is provided for the transmission of energy and/or signals. The standard interface is thereby connected to the electronics device.

According to one design, the standard interface is designed as a two-wire interface. Known field bus protocols, for example, such as HART or Foundation Fieldbus, etc., are provided for communication via the standard interface.

In one design, thereby, the protocol used for signal transmission via the interface provided according to the invention differs from the protocol that is implemented by the standard interface.

In one design, the electronics device processes at least the primary signal of the sensor device and generates at least one output signal from the primary signal. The interface and the electronics device are thereby connected to one another for transmitting the output signal.

In the above design, the electronics device processes the primary signal and generates output signals from it—e.g., in conjunction with stored calibration data or in conjunction with further measured values.

Alternatively, the primary signals that directly have the value of the measured variable to be determined and don't have to be derived from measured values dependent on the measured variable are converted into formats that are directly accessible for communication via a fieldbus or another signal connection of the process automation. In this manner, for example, a primary signal that already has the value of the measured variable is transformed into a 4 . . . 20 mA signal as output signal. Such—or otherwise distinctive—an output signal is issued via the interface. For this, it is necessary that a signal connection be supplied from the electronics device to the interface. This is the case because, in the prior art, such output signals are not normally communicated in the direction of the sensor device and thus in the direction of the transition section.

In an alternative design, the electronics device is principally used for energy supply or control of the sensor device, so that the primary signal does not have to be processed. For this, it is usually provided that the sensor device itself has an appropriate processing possibility.

The following design is provided for the case that signals, which to not allow for direct communication due to their content or form, are tapped or input via the interface.

In one design, the interface is assigned at least one converter device that allows for the transformation of signals.

If, for example, the signals that are transmitted via the signal line are alternating current signals and only one amplitude value is to be transmitted via the interface, then the converter device in this example reduces the signals to amplitudes. Alternatively, a certain pre-processing and content transformation of the signals in the signal line into the signals to be issued via the interface can take place.

In a further variation, the signals between the sensor device and the electronics device are transformed into radio signals by the converter device.

Overall, the converter device is a sort of intelligence of the interface. The converter device also allows signals that are input in the measuring device via the interface to be transformed into formats that are available for the measuring device.

In an additional design, the signals input into the measuring device via the interface are transformed into signals by the converter device with given signals in the measuring device or, respectively, with prevailing conditions or with data stored for the measuring device. These signals finally then enter the measuring device or possibly cause changes or adjustments there.

The following designs deal with the direct contact of the signal line.

One design provides at least one contact element. The contact element is used for transmitting energy and/or signals between the signal line and the interface.

The contact element is a connection between the signal line and the interface, and thus, for example, also between the signal line and the converter device. Further elements or devices can, thus, be placed between the signal line and the interface.

In one design, the contact element is designed in such a manner that the contact element interrupts the transmission of energy and/or signals via the signal line in at least one state and allows at least the transmission of signals between the signal line and the interface.

The mentioned state is thus the state in which access to the measuring device is made possible via the interface. This is also the connecting state in which the reversible connection between the interface and the signal line is present.

In one design, the contact element—possibly in conjunction with further elements or components—produces an opening of a possibly existing device (e.g., at least a part of the a housing) surrounding the signal line and of the signal line itself for direct contact to the signal line. In this design, the signal line itself is disconnected so that direct electric contact is possible and the interface is thereby created as direct physical or electric transition to the signal line.

In one case, this design also leads to the interface as access to the signal line first ensuing by means of the contact element.

In at least one design, the contact element is used for the reversible activation of the connection between interface and signal line in that, depending on the state of the contact element, access to the interface is first possible or, respectively, is revoked.

The states of the contact element are transposed as opening and closing. This occurs in one design by a mechanical removal or replacement/reinsertion of the contact element.

Thus, it is provided in one design that the contact element allows the transmission of energy and/or signals via the signal line in at least one standard state.

In one design, the contact element is designed at least partially as an electrical conductor that is located between two sections of the signal line in the standard state and is in electrical contact to both sections. Thus, for example, the signals flow from one section to the other of the signal line over the contact element, so that the signal flow is interrupted without the contact element or, respectively, when the contact element has been removed.

In one variation, the contact element is designed partially thorn-like for insertion in the signal line.

In this design, the contact to the signal line is created in that a thorn-like contact element is inserted or pushed into the actual conductor structure. Additionally, clamps are also optionally provided for attachment of the contact element to the signal line.

In an alternative design, the contact element can be at least partially inserted into or removed from the signal line like a plug.

If, in one design, the contact element is removed from the signal line as part of the signal line, then, in particular, two passageways to the parts of the remaining signal line result for connecting, for example, a so-called handheld or other mobile element for importing or reading data or signals.

In one design, the signal line is formed at least partially of glass fiber that has a removable piece in the form of the contact element. Accordingly, the contact element also formed at least partially of glass fiber at least for signal transmission.

Furthermore, one design provides at least one flap—in one design also for closing the interface. The flap is assigned at least to the interface.

In one design, it is provided that the flap and the contact element interact.

It is particularly provided in one design, that the contact element is moved into or out of the standard state through the flap. Accordingly, the flap is hereby used to create the reversible connection between the interface and the signal line by means of the contact element.

The flap is thereby, in one design, locked by means of form fit in that the flap, for example, is pushed onto the outer edge of the interface. Alternatively, the flap has a threading that fits a threading on the interface so that the flap can be screwed on. A possibly required measure of security can thereby be achieved via the number of thread turns.

This is associated with a further design, in which the interface is designed for use in surroundings at risk of explosion.

Thus, due to the interface, a possibly required intrinsic safety does exist, insofar as no currents or voltages are created or released that could lead to an explosion in an area at risk of explosion. Accordingly, temperatures that could be dangerous are also not generated.

A design is associated with this, in which the interface carries out self-monitoring in view of the transmitted signals and the applied energy.

According to a design, the electronics device is assigned to at least one electronics housing. Furthermore, the sensor device is assigned to at least one sensor housing. Additionally, the interface is arranged at least partially in an adapter housing, wherein the adapter housing is finally connected to the electronics housing and the sensor housing.

In this design, the interface is at least partially arranged in an adapter housing that is connected to the electronics housing and the sensor housing and that is designed to fit to those respective geometries. This fit is thus not only carried out in respect to the two other housings, it is also carried out taking into account the special requirements of the interface and the units or components possibly connected to the interface.

Thus, in one design, the adapter unit is made more narrow compared to the adjacent areas of the sensor or electronics housings and, in an alternative design, is provided with a larger diameter than at least one of the two adjacent housings. In a further design, the adapter unit is formed in the shape of a T piece.

In another design, the adapter unit contains means for a galvanic separation or other elements for use in areas at risk of explosion.

In one design, the adapter housing is thereby firmly attached to the sensor housing and electronics housing. In an alternative design, the connection with at least one of the two above-mentioned housings (electronics housing and sensor housing) is reversible, and in an additional design, the adapter housing is reversibly connected to the sensor housing and electronics housing.

In the latter design, an additional design can also possibly be associated with it that makes is possible to attach the adapter housing and thus the interface only temporarily to the measuring device or to extend measuring devices already installed in a process in their functionality or accessibility.

Thus, one design is characterized in that the electronics housing and the sensor housing can be reversibly connected to one another.

Due to this reversible connection, it is possible to expand the measuring device formed by them by the adapter housing and the interface. This goes hand in hand with the transition section being quasi extended or elongated through the adapter housing in the state of the mounted adapter housing.

If the connections between adapter, electronics and sensor devices are reversibly connectable, then the adapter housing can be installed and removed again as necessary.

In one design, the electronics device is assigned at least one electronics housing and the sensor device is assigned at least one sensor housing. The interface is at least partially arranged in a clamp element and the clamp element is attached in the transition section.

In this design, a temporary implementation or, in particular, a functional expansion of existing and installed measuring devices is also intended. For this, the interface is at least partially arranged in a clamping element, which is attached—in particular, reversibly—in the transition section between the sensor housing and the electronics housing. The clamping element clamps, for example, around the neck-shaped transition section.

Another design is associated with this, according to which the transition section is formed at least partially by the sensor and/or electronics device or, respectively, the housing assigned thereto. This design can be thereby implemented independent of the use of a clamping element.

A reversible signal transmission connection between the interface and the signal line is implemented in one design in that a sending/receiving unit for sending or receiving electromagnetic waves is provided for each of the signals of the signal line and for the interface in order to implement a wireless connection. Such communication through a housing is made easier when the transition section is made of a plastic that is permeable for radio waves.

Alternatively, the interface and the signal line are connected to one another via a cable or other electric conductor.

In another design, a magnetic-inductive or capacitive transmission of signals or energy is provided.

In one design, the electronics housing and the sensor housing are designed as closed units. Both housings are, thus, designed separately from one another, i.e., are units also accordingly closed to the environment. A mechanical connection does not directly exist and both housings are, in particular, not in contact with one another.

Furthermore, in one design,—preferably only—the signal line between the electronics housing and the sensor housing creates a—data or energy related—connection.

In the last-described design, the electronics housing is set off from the sensor housing and, in particular, contact only exists via the signal line. This is advantageous, for example, when the sensor device is located near a process in which extreme conditions, e.g., high temperatures, prevail, from which the components of the electronics device need to be protected. In this design, the signal line thus quasi also forms the transition section.

In an associated design, the interface is assigned to the electronics housing or the sensor housing. The interface is thus more likely to be arranged close to the electronics or sensor housing and is also, for example, a component of the respective housing.

The reversible connection is thus, in one design, given in that the signal line is in contact with the interface as a sort of beginning of the transition section, i.e., the signal line is connected to the interface. The interface is thereby, in one design, designed in the form of a classical standard interface.

According to the respective implementation, the sensor device is designed for measuring the flow, the fill level, the temperature, the pH value, the electric conductivity or the oxygen content. Further measured variables can also be implemented. Alternatively, the measuring device is used for determining or monitoring several measured variables.

In an alternative design, the measuring device influences the process to be monitored and sets a value as actuator or regulates the process. A further teaching is associated with this, in which a field device is designed as actuator and has command of an interface in the transition section between an electronics device and an adjusting device (e.g., valve).

In detail, there is a plurality of possibilities for designing and further developing the measuring device according to the invention. Reference is to the following description of embodiments in conjunction with the accompanying drawings.

DETAILED DESCRIPTION OF THE INVENTION

Figure 1:
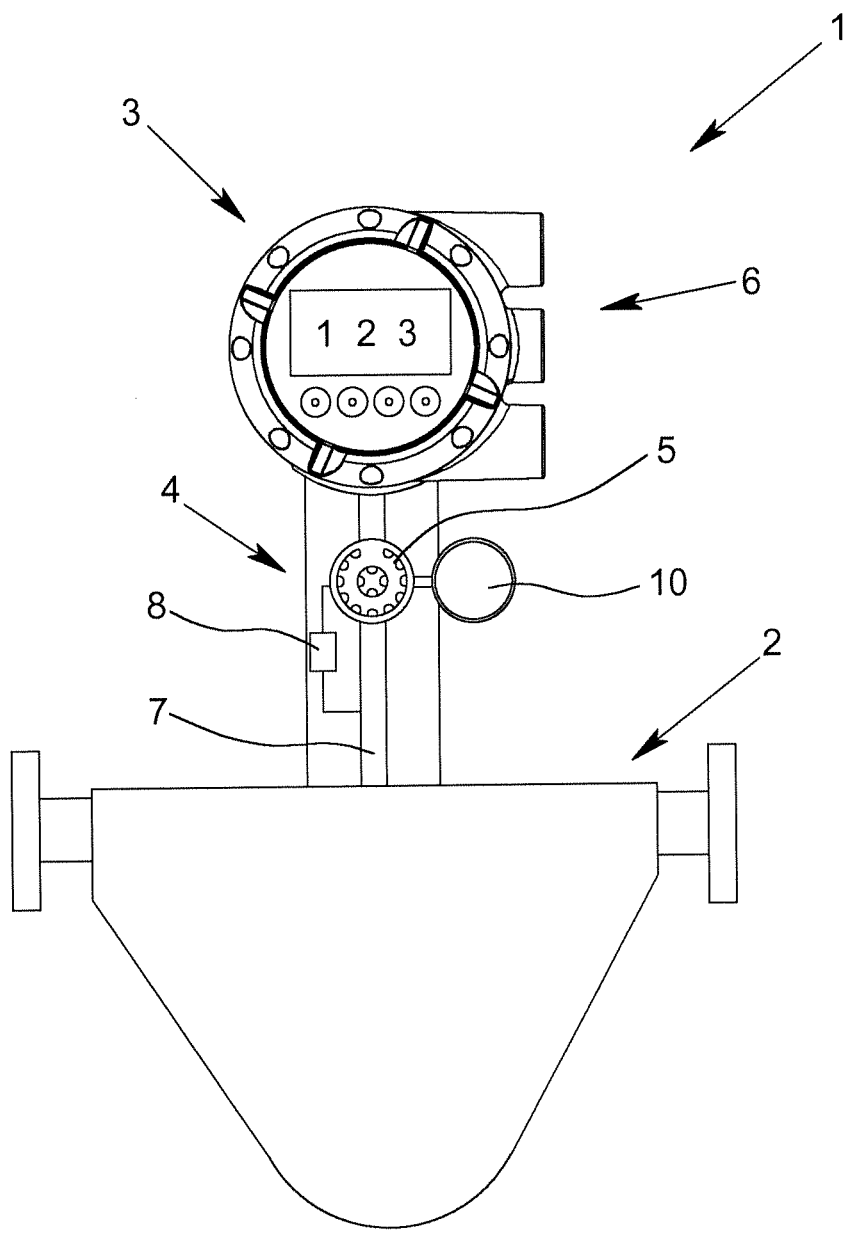
FIG. 1 is a schematic representation of a measuring device according to the invention in a first embodiment.

FIG. 1 shows a measuring device 1 that is used for measuring the flow of a medium. The sensor device 2 used for this is, for example, designed as a Coriolis flowmeter. For the purposes of the present invention represented here, the specific type of sensor device 2 used is of no importance.

For measurement, the sensor device 2 requires electric energy and generates, e.g., a phase difference from the measurement. The electronics device 3 is provided for supplying energy and further evaluating the phase difference as a measure of flow. The electronics device 3 has control and evaluation units, and for example, stores calibration data required for evaluation.

In order to access the signals of the sensor device 2, an interface 5 is provided in the transition section 4 between the sensor device 2 and the electronics device 3. In the example shown, this interface 5 is, in particular, a so-called service interface. In general usage, this is an interface that provides special access to the measuring device for service or maintenance staff or also for the producer. Large amounts of data can be communicated via these interfaces, in particular for software or firmware updates. Alternatively or additionally, this interface 5 is also connected to components, data or control sections of the measuring device, which are not directly accessible for the normal user, in particular, when using a normal standard interface.

Here, the interface 5 is located in the neck-shaped transition section 4 between the sensor device 2 and the electronics device 3. This interface 5 has the advantages of a service interface and is simultaneously very easily accessible due to its configuration.

As part of the electronics device 3, another standard interface 6 is provided, via which energy supply is carried out and via which normal output signals of the electronics device 3 are emitted.

The sensor device 2 and the electronics device 3 are connected via a signal line 7 for signal transmission, which is also in contact with the interface 5.

In order for signals to be able to be emitted via the interface 5 for standard protocols (e.g., 4 . . . 20 mA, HART, or Foundation Fieldbus), a converter device 8 is provided, which, for example, can be configured via the interface 5 and, starting from there, taps and transmits the signals flowing over the signal line 7 in a format that can be output by the interface 5. Using the converter device 8, conversely, control commands can be input via the interface 5 from outside and translated for the sensor device 2 or the electronics device 3.

A cover flap 10 for closure and protection is provided, which is connected to the transition section 4 as not to be lost and which, in the case that the interface 5 is not required for use, can be placed over it or possible screwed on. A measure of safety for the measuring device 1 or the interface 5 and its use can be set using the number of thread turns.

Figure 2:
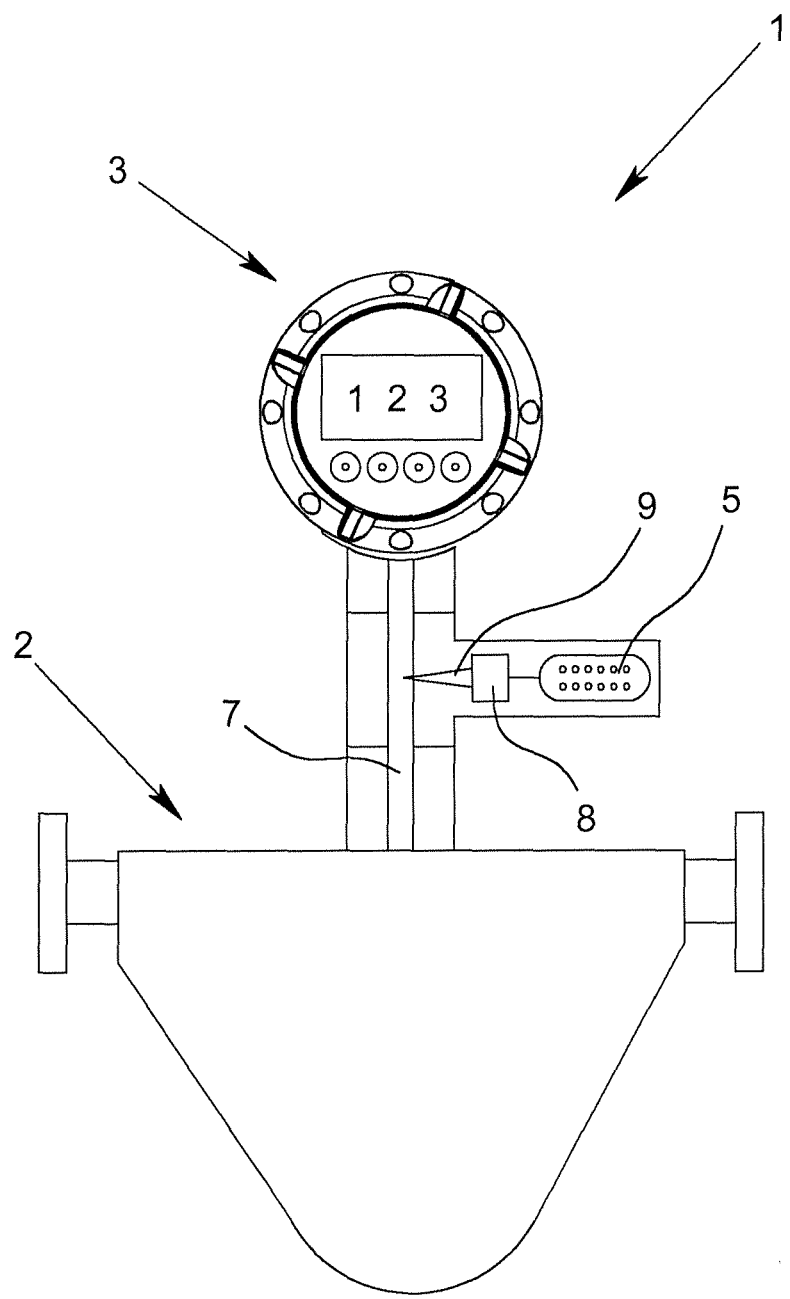
FIG. 2 is a schematic representation of a partially cut measuring device according to the invention in a second embodiment.

An alternative design to the measuring device 1 of FIG. 1 is shown in FIG. 2. The sensor device 2 is also used for determining flow, however, no standard interface is provided, so that the electronics device 3 communicates via the interface 5.

Thereby, the interface 5 is connected to a thorn-shaped contact element 9 via the above-described converter device 8, which is inserted in the signal line 7 and thus creates contact between the signal line 7 and the converter device 8. This allows for a subsequent upgrade of an already-existing measuring device, possibly already installed in the process. It can also be seen here that the interface 5 is slightly offset.

Figure 3:
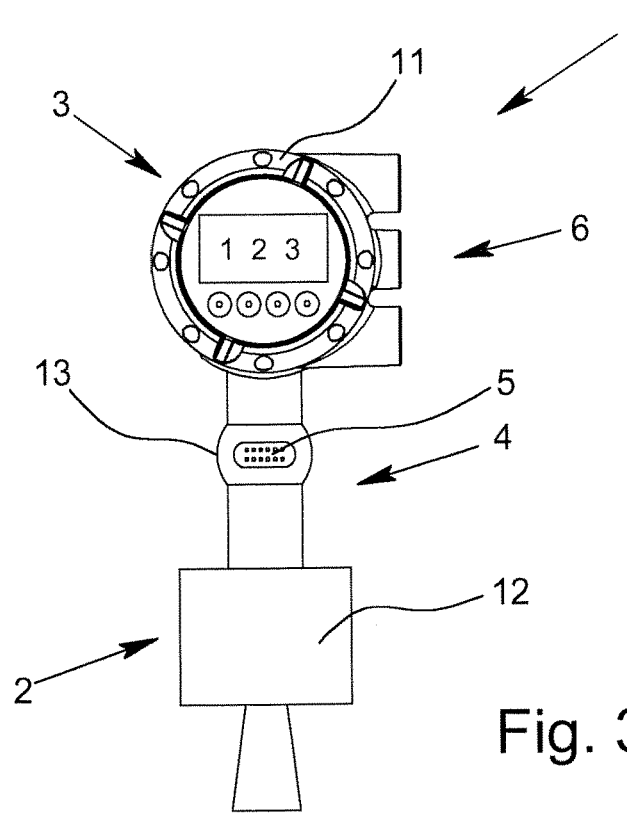
FIG. 3 is a schematic representation of a measuring device according to the invention in a third embodiment.

FIG. 3 shows a further measuring device 1, which is used for determining the fill level of a medium—not shown here. Using the radar principle with the implied antenna, the shown sensor device 2 allows for the measurement of the distance between the measuring device and a medium, whose surface reflects microwave signals emitted by the sensor device.

A sensor housing 12 is assigned to the sensor device 2 and an electronics housing 11 is assigned to the electronics device 3. The interface 5 is located in an adapter housing 13 that is provided in the transition section 4 between the two housings 11, 12. The transition section 4 between the sensor device 2 and the electronics device 3 is elongated by the adapter housing 13.

It is further implied in the FIG. 3 embodiment that the adapter housing 13 has been inserted between the sensor housing 12 and the electronics housing 11. The adapter housing 13 is thereby designed to fit to each of the housings 11, 12 at two sections or, respectively, at two ends, so that, in particular, a tight connection can be created. Furthermore, the sensor housing 12 and the electronics housing 11 are designed so that they fit onto one another and also are able to create a tight connection. Thus, in one state, the measuring device 1 is formed of only of the sensor housing 12 and the electronics housing 11, and in another state, is formed of the sensor housing 12, the electronics housing 11 and the adapter housing 13. In each of the states, a complete and sealed measuring device 1 is the result.

In the FIG. 3 embodiment, a'normal measuring device that does not have an interface 5 can be expanded by the interface 5 via fitting geometries of the adapter housing 13. Alternatively, the interface 5 is only temporarily inserted between the sensor device 2 and the electronics device 3, wherein the transition section 4 is also tight and sturdy in this expanded state.

The connection between the sensor housing 12, the electronics housing 11 and the adapter housing 13 and the design of the interface are implemented so that the use of the expanded measuring device 1 is possible and permitted in surroundings at risk of explosion.

Figure 4:
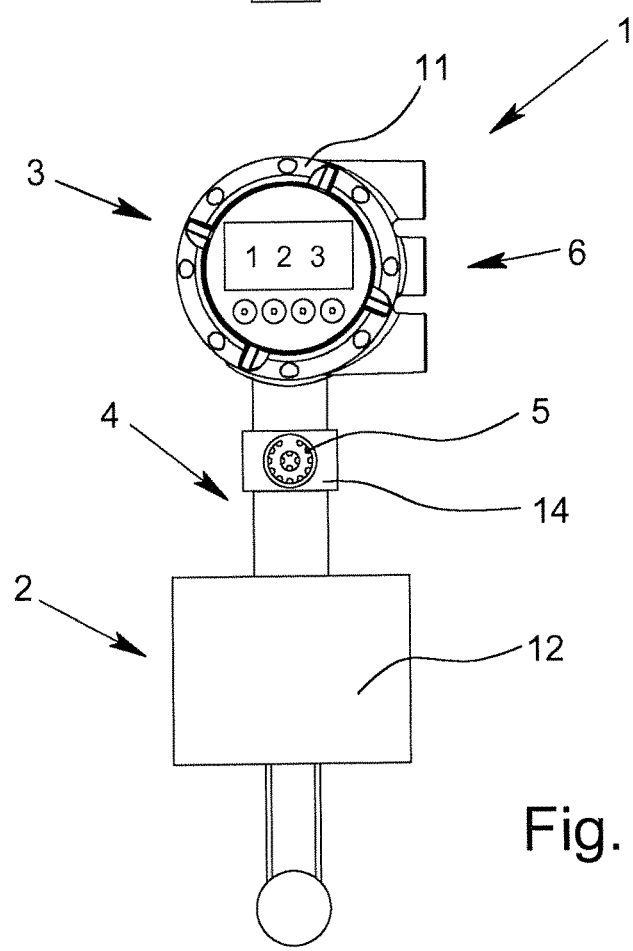
FIG. 4 is a schematic representation of a measuring device according to the invention in a fourth embodiment.

A sensor device 2 for measuring the pH is shown in FIG. 4 with the measuring device 1 shown there. The transition section 4 between the electronics housing 11 and the sensor housing 12 is surrounded by a clamp element 14, which is assigned to the interface 5 and which also bears the interface 5. The clamp element 14 produces a temporary connection to the transition section 4 for the interface 5, and thus, indirectly to the signal line 7 arranged therein.

The measuring device 1 is comprised of the two devices: sensor device 2 and electronics device 3, however, which result overall in a one-piece measuring device 1.

Radio waves, for example, are used for communication of signals or energy between the interior of the measuring device 1 or, depending on the design, its signal line and the interface 5. Alternatively, an inductive or capacitive coupling is exploited. In order to make this easier, the transition section, in particular, is formed of a plastic, or at least does not consist of metal.

FIG. 5a) and the enlarged detail of the encircled portion of FIG. 5a shown FIG. 5b) are cross-sectional side views through a measuring device 1 according to the invention in two different states.

A transition section 4 is located between the sensor housing 12 and the electronics housing 11, which is designed here in a neck-shaped and pipe-shaped manner. The signal line 7 for transmitting signals from the sensor device to the electronics device (both not shown here) and for transmitting energy from the electronics device to the sensor device is located in this neck.

The contact element 9 in FIG. 5a)—for clarifying the standard state—is pushed into the signal line 7 and allows the transmission of signals and energy over it.

The flap 10 forms the end of the neck-shaped, housing-like transition section 4, and is arranged in a corresponding recess of the transition section 4 so as to implement a mechanical termination.

FIG. 5b) shows a special state in which the direct flow of the signal via the signal line 7 is interrupted and in which a direct connection results between the signal line 7 and the interface 5, e.g., for reading signals. This is implemented in the illustrated embodiment in that the contact element 9 has been removed.

This state thus allows for access to the sensor device or electronics device via the interface 5 in that, e.g., the signals are tapped by the sensor device or in that test signals are transmitted to the electronics device. Just the flow of the signal via a unit connected to the interface 5 can be implemented, and thus, signals can be tapped.

Figure 5:
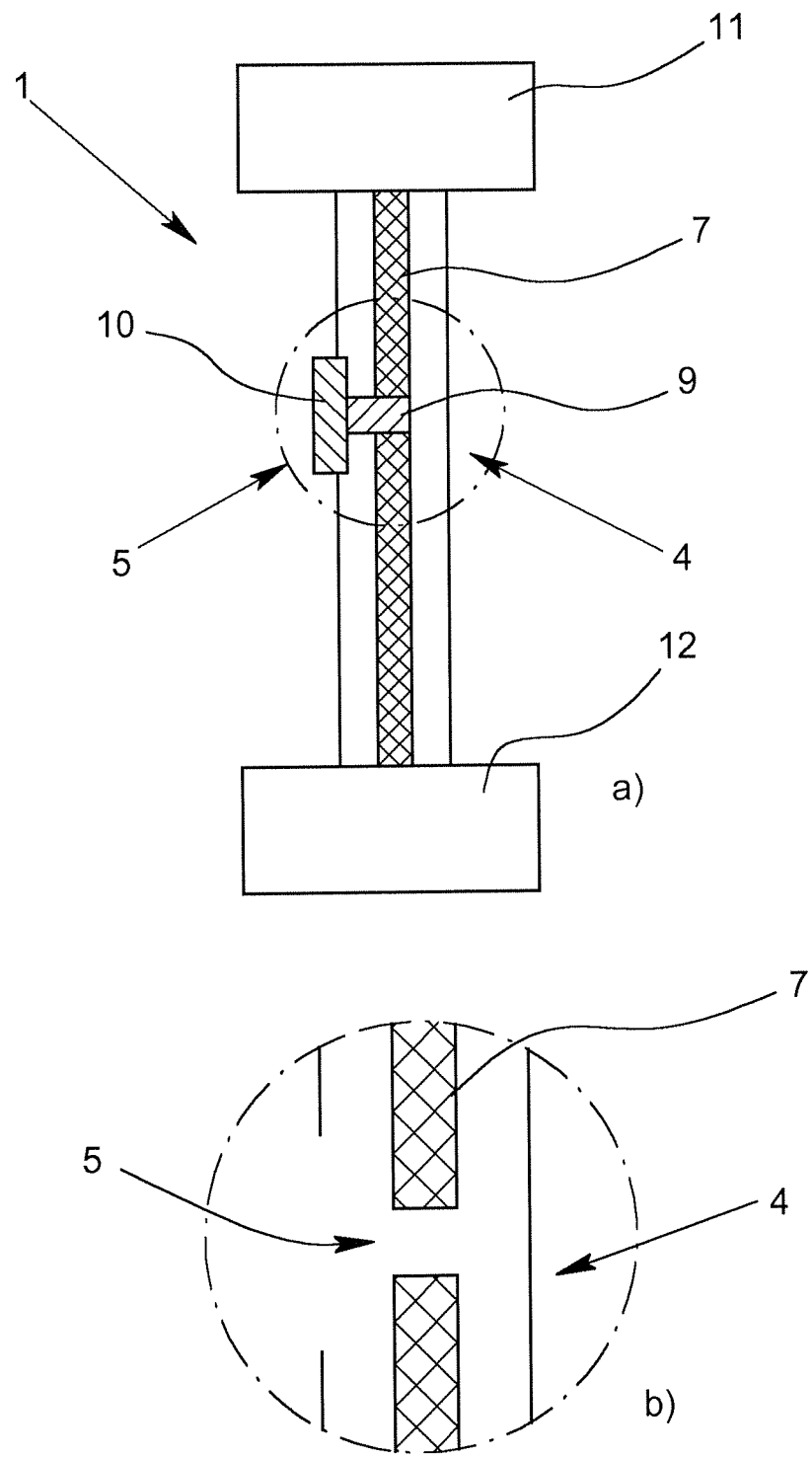
FIGS. 5a & 5b are schematic representations of a measuring device according to the invention in a fifth embodiment in two different states.

The transition between the two states of FIGS. 5 a) and 5b) is implemented in that the flap 10 is removed or introduced. The flap 10 is tightly connected to the contact element 9 here.

If the flap 10 is brought into the standard position, i.e., it closes the opening in the transition section 4, then the contact element 9 is located in the signal line 7 again and allows the flow of signals and energy via the signal line 7.

Figure 6:
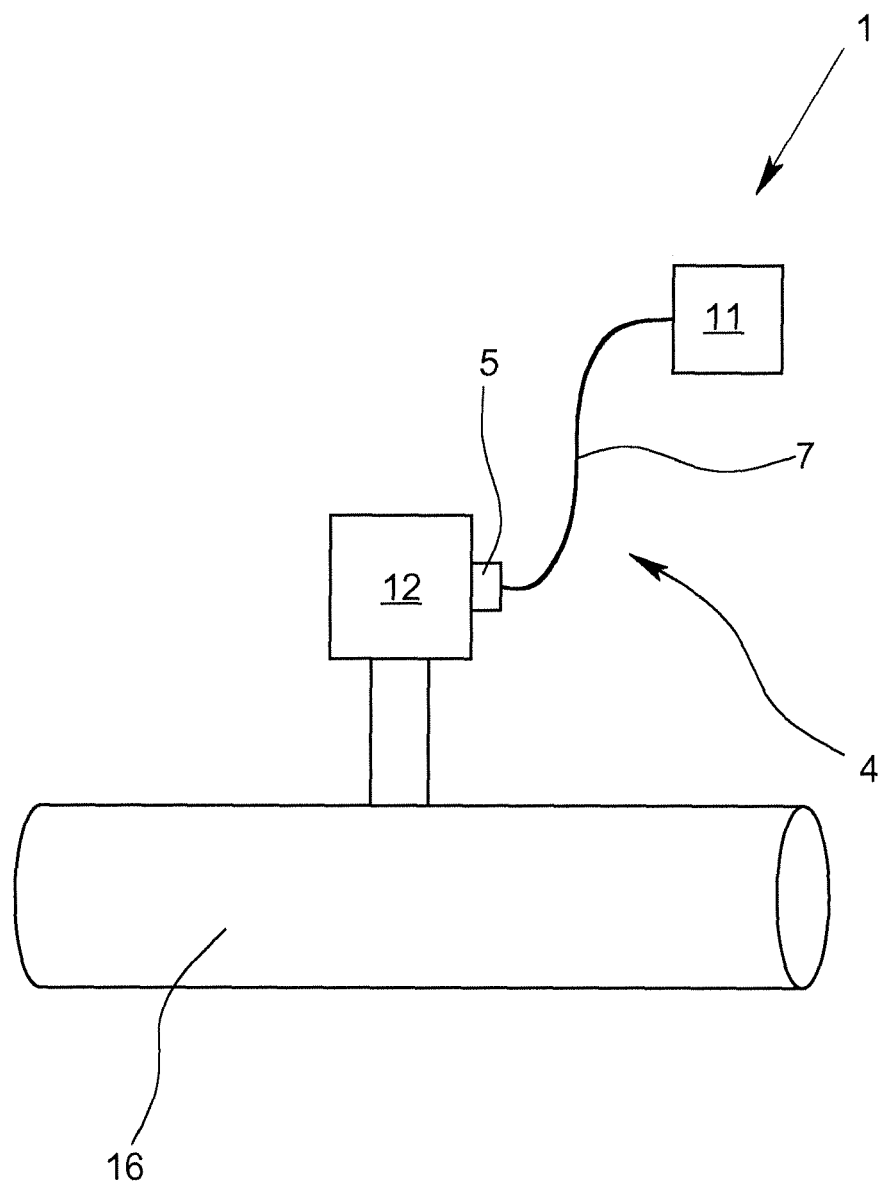
FIG. 6 is a schematic representation of a measuring device according to the invention in a sixth embodiment.

FIG. 6 shows a variation of the measuring device 1 in which the electronics device is offset compared to the sensor device. For this, the sensor housing 12 and the electronics housing 11 are closed units.

A data or energy connection between the sensor device or electronics device—not shown here—located in the housings 11, 12, is created by the signal line 7, which, here, also essentially forms the transition section 4. For this purpose, the signal line 7 is preferably designed to be sturdier and more resilient than in the design as purely a line within a neck-shaped section.

For example, what is measured here is the flow of a medium—not shown here—through a tube 16, to which the sensor housing 12 is attached.

Here, the interface 5 is assigned to the sensor housing 12, and in particular, is a part of the sensor housing 12. For this, in particular, a so-called PG connection is provided, as an example.

The signal line 7 connects the two housings 11, 12, and in particular, transmits the signals. Thus, the signal line 7 also forms a part of the transition section 4, the interface 5 being quasi arranged at its start.

The reversible connection is created by connecting the signal line 7 to the interface 5.

What is claimed is:

1. A measuring device for determining a measured variable, comprising:
    at least one sensor device,
    at least one electronics device,
    at least one transition section located between and mechanically connecting the sensor device and the electronics device, the at least one transition section being located at an accessible location,
    at least one interface device arranged in the transition section for transmitting at least one of energy and signals, and
    at least one signal line electrically connected to and extending between the sensor device and the electronics device for enabling data transmission between the sensor device and the electronics device over the at least one signal line, wherein the signal line is a separate element from the transition section, such that the transition section and the signal line separately and independently connect the sensor device and the electronics device to one another, the signal line being tapped by the at least one interface device for enabling signals of the sensor device to be tapped before a transition to the electronics device thereby enabling access to data on the signal line bypassing the electronics device,
    wherein the sensor device is operable to generate at least one primary signal depending on the measured variable to be determined,
    wherein the at least one interface device and the signal line are removably connectable for connecting and disconnecting communication between the at least one interface device and the signal line, and
    wherein the transition section remains mechanically connected to the sensor device and the electronics device regardless of whether the interface device and the signal line are connected or disconnected from one another.

2. The measuring device according to claim 1, wherein at least one contact element is provided for transmitting the at least one of energy and signals between the signal line and the at least one interface device, and wherein, in at least one state of the measuring device, the contact element interrupts transmission of said at least one of energy and signals via the signal line and enables at least the transmission of signals between the signal line and the interface.

3. The measuring device according to claim 2, wherein the at least one contact element allows said transmission of at least one of energy and signals via the signal line in at least one standard state.

4. The measuring device according to claim 1, wherein at least one flap is assigned to the at least one interface device.

5. The measuring device according to claim 4, wherein at least one contact element is provided for transmitting the at least one of energy and signals between the signal line and the at least one interface device, and wherein, in at least one state of the measuring device, the contact element interrupts transmission of said at least one of energy and signals via the signal line and enables at least the transmission of signals between the signal line and the at least one interface device, and wherein the flap and the contact element are assigned to one another.

6. The measuring device according to claim 1, wherein the electronics device is assigned to at least one electronics housing and wherein the sensor device is assigned to at least one sensor housing.

7. The measuring device according to claim 6, wherein the at least one interface device is arranged in an adapter housing and wherein the adapter housing is connected to at least one of the electronics housing and the sensor housing in an interruptible manner.

8. The measuring device according to claim 7, wherein the electronics housing and the sensor housing are connectable to one another in an interruptible manner.

9. The measuring device according to claim 6, wherein the electronics housing and the sensor housing are each closed units and wherein the signal line forms a connection between the electronics housing and the sensor housing.

10. The measuring device according to claim 9, wherein the interface is assigned to one of the electronics housing and the sensor housing.

11. The measuring device according to claim 1, wherein the measuring device has only the at least one interface device for transmitting energy and signals.

* * * * *